United States Patent [19]
Hyun et al.

[11] Patent Number: 6,042,652
[45] Date of Patent: Mar. 28, 2000

[54] ATOMIC LAYER DEPOSITION APPARATUS FOR DEPOSITING ATOMIC LAYER ON MULTIPLE SUBSTRATES

[75] Inventors: Kwang-Soo Hyun; Kyung-ho Park, both of Sungnam; Neung-goo Yoon, Cheonan; Kang-jun Choi, Pyeongtaek; Soo-hong Jeong, Sungnam, all of Rep. of Korea

[73] Assignee: P.K. Ltd, Rep. of Korea

[21] Appl. No.: 09/390,710

[22] Filed: Sep. 7, 1999

[30] Foreign Application Priority Data

May 1, 1999 [KR]  Rep. of Korea ...................... 99-15805

[51] Int. Cl.$^7$ ..................................................... C23C 16/00

[52] U.S. Cl. ............................ 118/719; 118/715; 118/725

[58] Field of Search .................................... 118/715, 719, 118/725

[56] References Cited

FOREIGN PATENT DOCUMENTS

| | | | |
|---|---|---|---|
| 61-190948 | 8/1986 | Japan | 118/715 |
| 63-16617 | 1/1988 | Japan | 118/715 |
| 3-142823 | 6/1991 | Japan | 118/715 |

*Primary Examiner*—Richard Bueker
*Attorney, Agent, or Firm*—Rothwell, Figg, Ernst & Kurz

[57] ABSTRACT

An atomic layer deposition (ALD) apparatus capable of depositing a thin film on a plurality of substrates. The atomic layer deposition apparatus includes: a vacuum chamber, a reactor installed in the vacuum chamber, having a plurality of modules which can be assembled and disassembled as desired, a plurality of stages as spaces partitioned by assembling the plurality of modules, and openings which allow each stage to receive one substrate; a gas supply portion installed in the reactor, for supplying reaction gases and a purging gas to the reactor; and a plurality of gas supply lines installed in the modules, for injecting the gases from the gas supply portion into the stages.

17 Claims, 8 Drawing Sheets

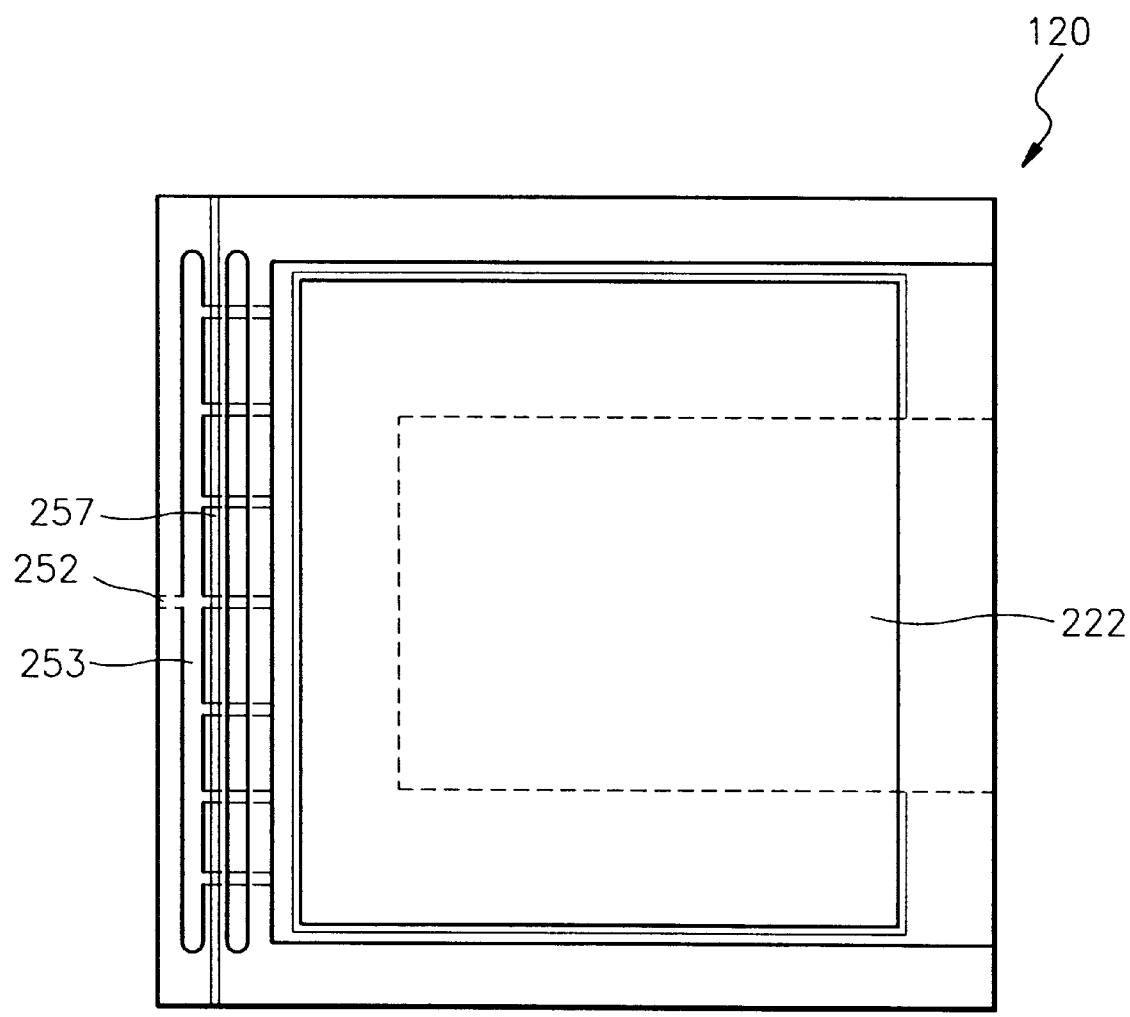

ATOMIC LAYER DEPOSITION APPARATUS FOR DEPOSITING ATOMIC LAYER ON MULTIPLE SUBSTRATES

BACKGROUND OF THE INVENTION

1. Field of the Invention

The present invention relates to an atomic layer deposition apparatus, and more particularly, to an atomic layer deposition apparatus for uniformly depositing a thin atomic layer on multiple substrates.

2. Description of the Related Art

As the size of semiconductor memory devices decreases, the technology for growing a uniform thin film with respect to depression of a fine pattern has become the focus of much interest. Such a thin film growing technology includes sputtering, chemical vapor deposition (CVD) and atomic layer deposition (ALD) methods.

According to the sputtering method, argon (Ar) gas as an inert gas is injected into a vacuum chamber in which high voltage is applied to the target, to generate Ar ions in a plasma state. Then, Ar ions are sputtered onto the surface of a target such that atoms of the target, which become dislodged from the surface of the target, are deposited on a substrate. High purity thin film with a good adhesion to the substrates can be formed by sputtering method. However, in the deposition of a thin film having a depression with a step difference, it is difficult to ensure uniformity over the entire thin film. Thus, application of the sputtering method to a fine pattern is very limited.

In the CVD method, the most widely utilized deposition technique, a desired layer is deposited on a substrate to a desired thickness, using decomposition and reaction of gases. First, various gases are injected into a reaction chamber and chemical reactions between the gases are induced with high energy such as heat, light or plasma, to deposit a thin film having a predetermined thickness on a substrate. The deposition rate of CVD can be increased by controlling the reaction condition of heat, light or plasma supplied as a reaction energy, or the amount and ratio of gases. However, the reactions are so rapid that it is difficult to control the thermodynamic stability of atoms. The CVD deteriorates physical, chemical and electrical properties of the thin films, and the uniformity of a thin film having a fine depression cannot be ensured as in the sputtering method.

In addition, the ALD method is for depositing an atomic layer by alternately supplying a reaction gas and a purging gas. A thin film having a high aspect ratio, uniformity in a depression, and good electrical and physical properties, can be formed by the ALD method. Also, the films deposited by the ALD method have lower impurity density than those formed by other deposition methods and a thickness of less than 200 Å is obtained with reproducibility.

For example, assuming that two reaction gases A and B are used, when only the reaction gas A flows into a reaction chamber, atoms of the reaction gas A are chemically adsorbed on a substrate (step 1). Then, the remaining reaction gas A is purged with an inert gas such as Ar or nitrogen ($N_2$) (step 2). Then, the reaction gas B flows in, and a chemical reaction between the reaction gases A and B occurs only on the surface of the substrate on which the reaction gas A has been adsorbed, resulting in an atomic layer on the substrate (step 3).

Thus, the ALD method used for depositing a thin film on a substrate can ensure perfect step coverage regardless of the morphology of the substrate. Also, the remaining gas B and the by-products of the reaction between two gases A and B are purged (step 4), and the thickness of the thin film can be increased by repeating the four steps. In other words, the thickness of the thin film can be adjusted in atomic layer units according to the number of repetitions.

FIG. 1 is a schematic diagram of a conventional ALD apparatus.

As shown in FIG. 1, the ALD apparatus comprises a vacuum chamber 10 and a heater 11 for heating a substrate 13 placed in the vacuum chamber 10 to an appropriate temperature. The substrate 13 is seated on a substrate holder (not shown) placed on top of the heater 11, and heated evenly by the heater 11. Also, a showerhead 15 through which a predetermined reaction gas flows into the vacuum chamber 10, is installed facing the surface of the substrate 13.

In the ALD apparatus, a predetermined reaction gas flows into the vacuum chamber 10 heated to an appropriate temperature, through the showerhead 15, and the reaction gas which has flowed into the vacuum chamber 10, is deposited on a fine pattern of the substrate 13 as one atomic-layer film. After deposition, the remaining gas is purged by a purging gas which is flowed following the reaction gas, to be discharged to the outside.

FIG. 2 is a schematic diagram of another conventional ALD apparatus.

As shown in FIG. 2, the ALD apparatus comprises a vacuum chamber 20 and a reactor 20a installed in the vacuum chamber 20. The reactor 20a is opened by the upper half thereof, and heaters 21 are installed above and below the reactor 20a. A single substrate 23 is seated in the reactor 20a and is heated evenly by the heaters 21.

In the ALD apparatus, a predetermined reaction gas flows in the reactor 20a through an inlet 25 and is then deposited as a thin film on the substrate 23. The remaining reaction gas is purged by a purging gas which is flowed following the reaction gas, to be discharged to the outside through an outlet 26.

However, while the conventional ALD apparatus can provide a thin film having a high aspect ratio, in addition to having a good uniformity over a depression, it can not be commercialized due to its low deposition rate and a separated deposition for each substrate.

The deposition rate in the conventional ALD apparatus can be increased by increasing the activation energy of gases. However, increasing the activation energy of gases causes CVD on the substrate, instead of forming an atomic layer, thereby negating the merits of the ALD method, such as good film properties or uniformity of a thin film over a depression.

SUMMARY OF THE INVENTION

It is an object of the present invention to provide an atomic layer deposition apparatus capable of depositing a thin atomic layer having a fine pattern on multiple substrates, thereby improving throughput.

To achieve the object of the present invention, there is provided an atomic layer deposition (ALD) apparatus for depositing an atomic layer on a plurality of substrates, comprising: a vacuum chamber; a reactor installed in the vacuum chamber, having a plurality of modules which can be assembled and disassembled as desired, a plurality of stages as spaces partitioned by assembling the plurality of modules, and openings which allow each stage to receive one substrate; a gas supply portion installed in the reactor, for supplying reaction gases and a purging gas to the reactor; and a plurality of gas supply lines installed in an assembly part of the modules, for injecting the gases from the gas supply portion into the stages.

Preferably, the reaction gases and the purging gas are discharged through the openings, and heating members are installed on upper and lower modules of the modules to keep the internal temperature of the reactors at a predetermined level. Also, the heating members may be heat-emitting blocks which can be inserted into the upper and lower modules.

Preferably, the ALD apparatus further comprises a lamp heater outside the vacuum chamber, for emitting light to keep the internal temperature of the reactor at a predetermined level.

Preferably, the stages can receive substrates, and have inner walls having a section corresponding to the shape of the substrates inserted thereinto.

Preferably, the substrates are circular semiconductor substrates and each stage comprises a circular receiving portion having a hollow portion, formed on the bottom of the stage, for receiving the semiconductor substrate, or the substrates are rectangular glass substrates and each stage comprises a rectangular receiving portion having a hollow portion, formed on the bottom of the stage, for receiving the semiconductor substrate.

Preferably, the gas supply lines comprise: first and second supply lines formed in the modules to be connected to the inner wall of each stage; and a third single line formed in the modules to be connected to each hollow portion. Also, the first and second supply lines each may comprise: an inlet; and a plurality of outlets connected to the inner wall of each stage having the section corresponding to the shape of the substrates inserted thereinto.

Preferably, the reaction gas and the purge gas are alternately supplied through the first and second supply lines, and only the purging gas is supplied through the third supply line so as to evenly distribute the temperature over the substrate and to prevent the deposition of a thin film on the underside of the substrate by the reaction gas.

Preferably, the flow rate of the purging gas flowing through the third supply line is 30% less than those of the reaction gases supplied through the first and second supply lines.

Preferably, the ALD apparatus further comprises semicircular first and second buffering lines connected to the first and second supply lines in the middle of the first and second supply lines, respectively, formed in the assembly part of the modules, for collecting the reaction gases provided through the first and second supply lines to supply the reaction gases to each stage with an equal pressure.

Also, the ALD apparatus further comprises straight first and second buffering lines connected to the first and second supply lines in the middle of the first and second supply lines, respectively, formed in the assembly part of the modules, for collecting the reaction gases provided through the first and second supply lines to supply the reaction gases to each stage with an equal pressure. Preferably, the ALD apparatus further comprises a third buffering line formed between the first and second buffering lines so as to prevent a chemical reaction of the reaction gases which leak through the gap of the module assembly from the first and second buffering lines.

Preferably, the reactor is formed of at least one material selected from the group consisting of titanium (Ti), aluminum (Al), molybdenum (Mo), tungsten (W), graphite, belyllia, silicon carbide and silicon nitride.

BRIEF DESCRIPTION OF THE DRAWINGS

The above object and advantages of the present invention will become more apparent by describing in detail preferred embodiments thereof with reference to the attached drawings in which:

FIGS. 6A and 6B are plan views of another example of the gas supply lines of FIG. 3.

DESCRIPTION OF THE PREFERRED EMBODIMENTS

Figure 1:
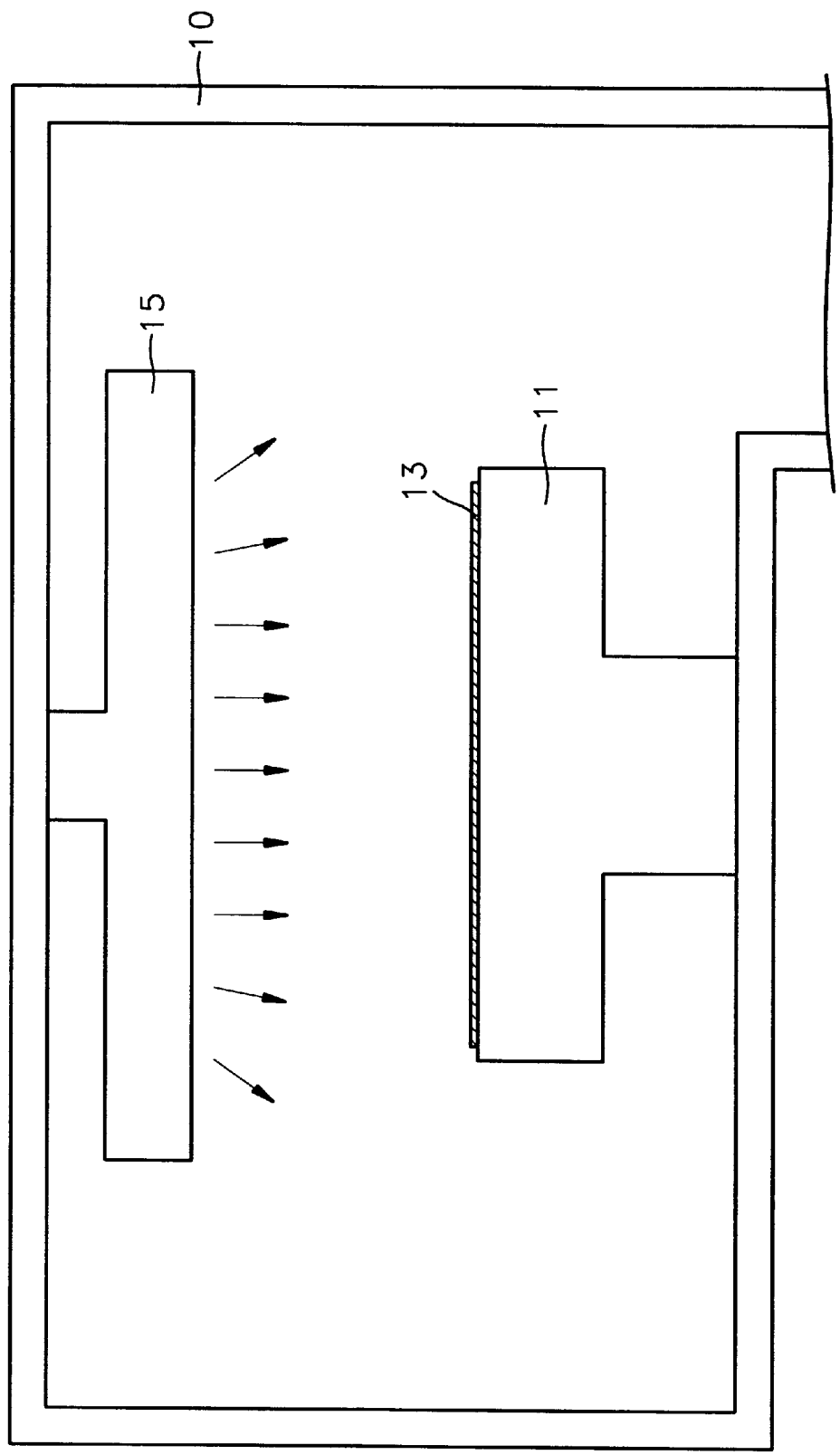
FIGS. 1 and 2 are schematic diagrams of conventional atomic layer deposition (ALD) apparatuses.
Figure 2:
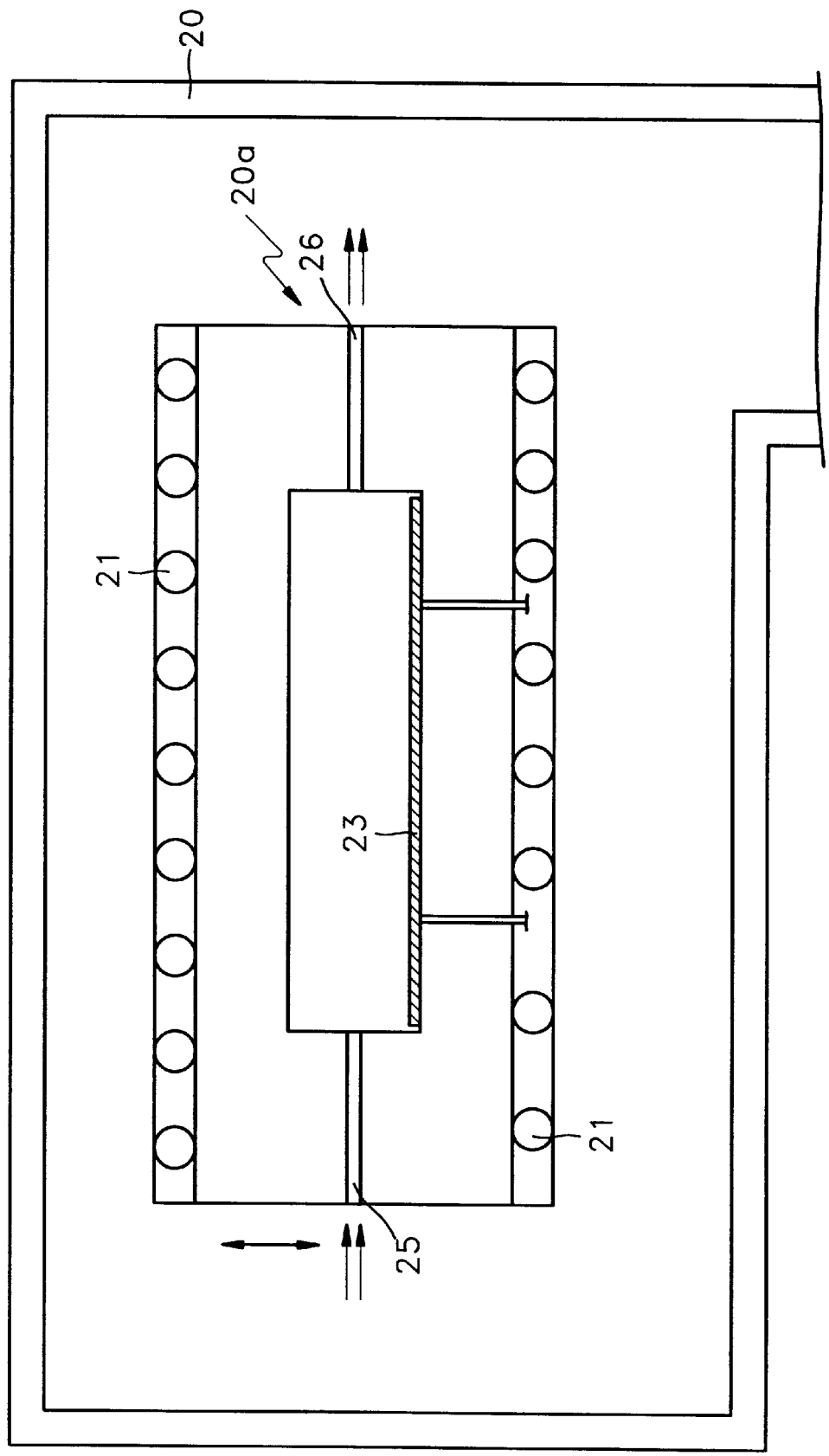
Figure 3:
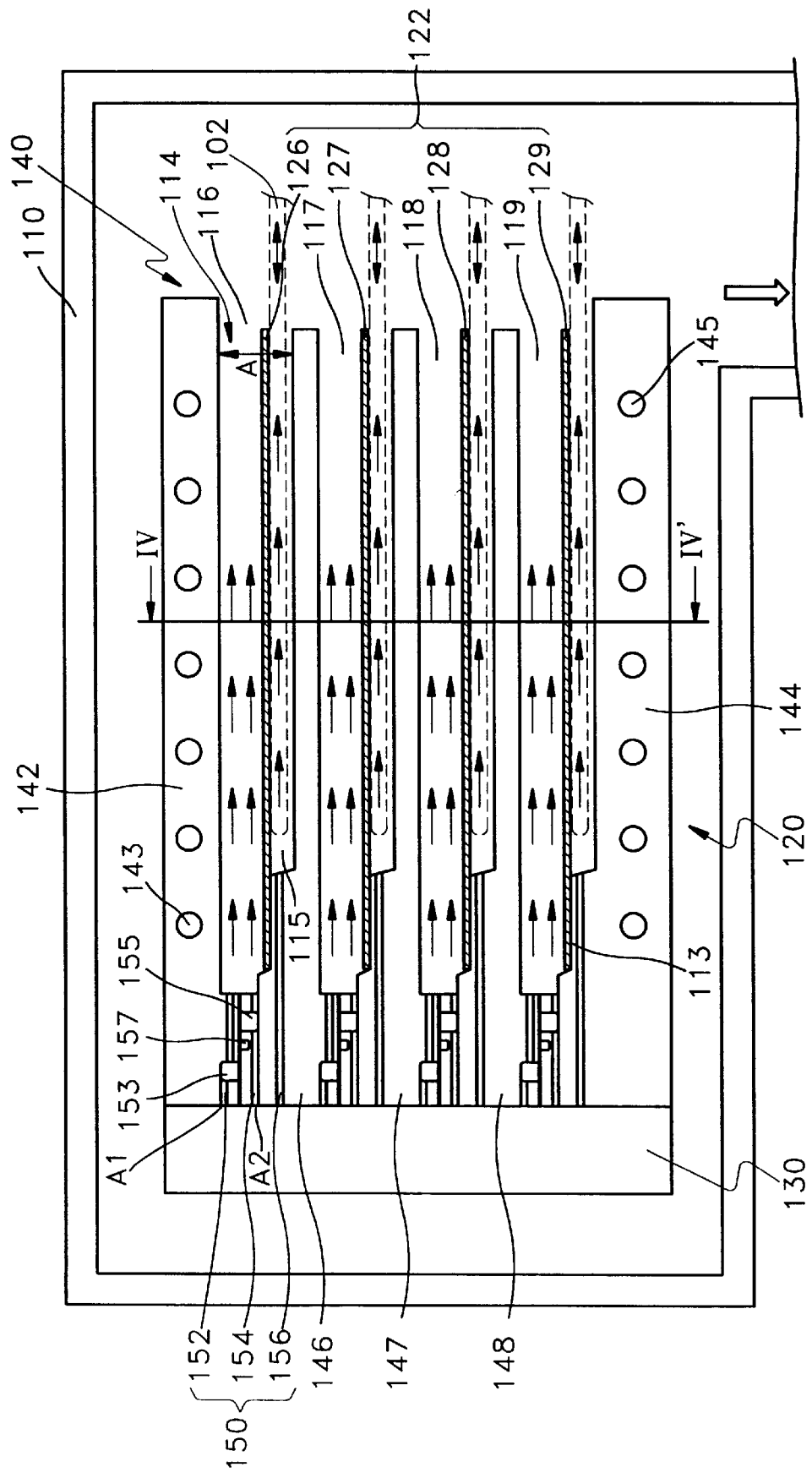
FIG. 3 is a sectional view of an ALD apparatus capable of depositing a thin film on multiple substrates according to an embodiment of the present invention.

Referring to FIG. 3, an atomic layer deposition (ALD) apparatus according to an embodiment of the present invention comprises a vacuum chamber 100, a reactor 120 installed in the vacuum chamber 110, which is capable of receiving a plurality of semiconductor substrates 122, and a gas supply portion 130 for supplying gases to the reactor 120.

The gas supply portion 130 is attached to the reactor 120 and supplies a reaction gas and a purging gas to the reactor 120 using a predetermined pumping means (not shown). The reaction gas is deposited as an atomic layer on the semiconductor substrates 122 and the purging gas purges the reaction gas remaining after deposition. Also, the vacuum chamber 110 is connected to a pump (not shown) for discharging the remaining gas from the reactor 120 to the outside. The semiconductor substrates 122 may be bare wafers or they may have an arbitrary film thereon, for example, an oxide film. Also, the semiconductor substrates 122 may have devices such as transistors before a metallization process for forming metal barriers. Hereinafter, the shape of the semiconductor substrates 122 is assumed to be circular.

The reactor 120 is formed of a material having good thermal conductivity and does not react well with the reaction gas. For example, the reactor 120 is formed of titanium (Ti), aluminum (Al), molybdenum (Mo), tungsten (W), graphite, belyllia, silicon carbide or silicon nitride.

The reactor 120 is formed by assembling a plurality of modules 140 which can be disassembled as desired, having a plurality of openings A at one side of the assembly. Inner space of the reactor 120 is partitioned by the modules 140, resulting in a plurality of stages 114 each of which receive one semiconductor substrate 122 through the corresponding opening A. The minimum width of the openings A is determined such that the semiconductor substrates 122 are easily delivered into the stages 114 and taken out of the same.

The modules 140 include an upper module 142, a lower module 144 and first, second and third modules 146, 147 and 148 which are interposed between the upper and lower modules 142 and 144. Heating members 143 and 145 are installed in the upper and lower modules 142 and 144, for maintaining the temperature of the inner space of the stages 114 at a predetermined temperature. The heating members 143 and 145 may be heat-emitting blocks which can be inserted into the upper module 142 and the lower module 144.

In addition, a lamp heater (not shown) can be installed outside the vacuum chamber 110. The lamp heater emits light into the reactor 120 through a transparent window (not shown) of the vacuum chamber 110, thereby heating the stages 114 to a predetermined temperature.

The first module 146 is connected to the upper module 142, forming a first stage 116 which is capable of receiving a first semiconductor substrate 126. The second module 147 is connected to the first module 146, forming a second stage 117 which receives a second semiconductor substrate 127, and the third module 148 is connected to the second module 147, forming a third stage 118 which receives a third semiconductor substrate 128. Also, the lower module 144 is connected to the third module 148, forming a fourth stage 119 which is capable of receiving a fourth semiconductor substrate 129.

In this embodiment, the stages 114 of the reactor 120 are constructed by assembling five modules 140 so as to receive four semiconductor substrates 122. However, the structure of the reactor 120 can be modified with more modules 140 to be capable of receiving 5 or more semiconductor substrates 122 within the range where the temperature and pressure distribution is uniformly maintained to ensure the uniformity of a thin film.

Also, circular receiving portions 113 on which the semiconductor substrates 122 are seated, are formed at the bottom of the stages 114, and hollow portions 115 each having a minimum allowance which allows a substrate transfer device 102 such as a robotic arm to easily go into and out of the stages 114, are formed underneath the receiving portions 113. Only the purging gas flows in the space, and thus the purging gas can prevent the reaction gas from flowing in the space so as not to deposit an atomic layer formed by the reaction gas on the underside of the semiconductor substrates 122.

Preferably, the contact area between the receiving portions 113 and the semiconductor substrates 122 is as large as possible in consideration of achieving the uniform temperature distribution over the semiconductor substrates 122.

The reactor 120 comprises a plurality of gas supply lines 150 connected to the gas supply portion 130. The gas supply lines 150 supply the reaction gas and the purging gas from the gas supply portion 130 to the stages 114. The gas supply lines 150 are formed in the modules 140 and are connected to the stages 114. The reaction gas and purging gas are injected into the stages 114 through the gas supply lines 150 and then discharged out of the reactor 120 through the openings A.

Figure 4:
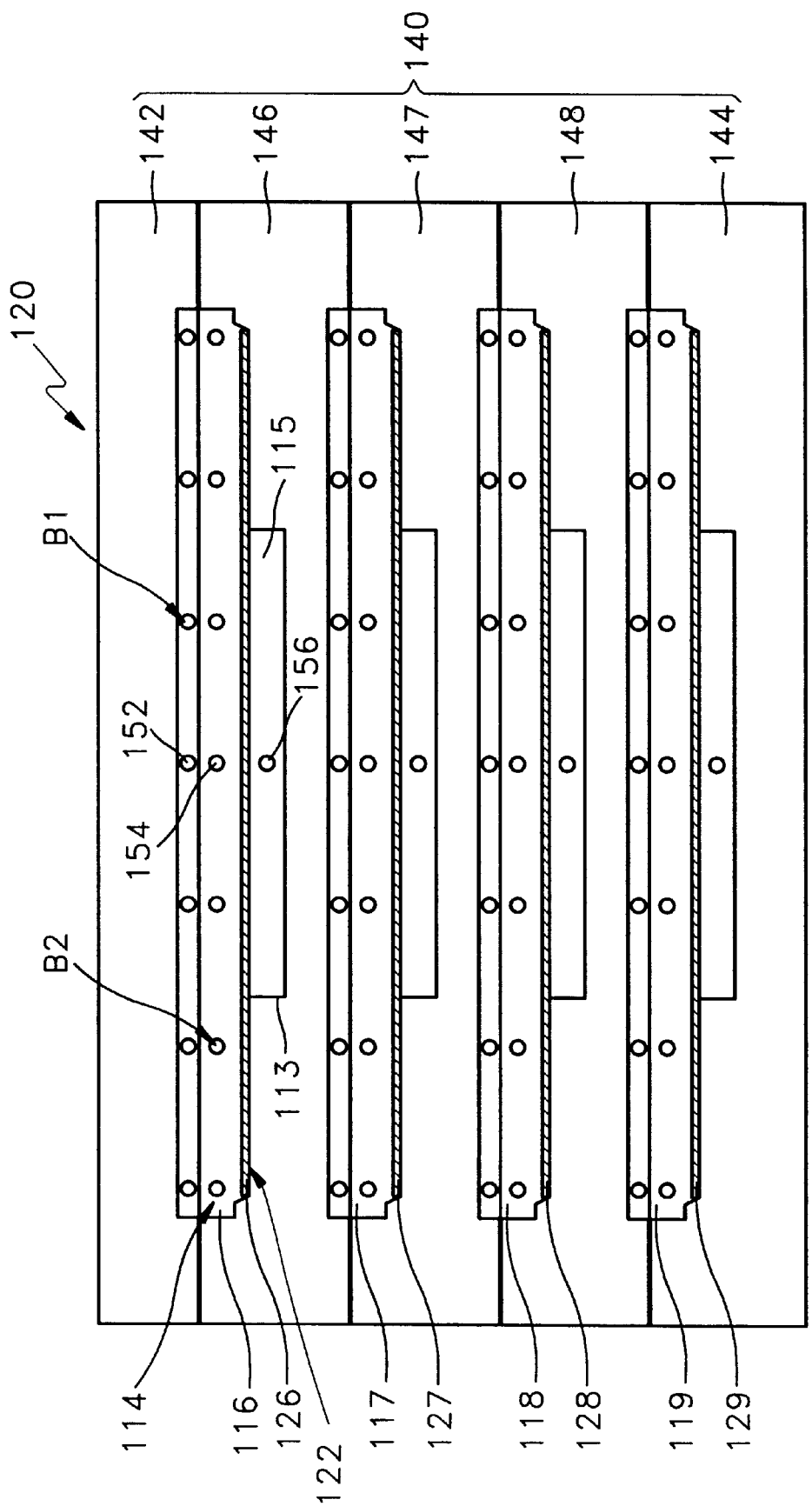
FIG. 4 is a sectional view of the ALD apparatus, cut along line IV-IV' of FIG. 3.

Referring to FIGS. 3 and 4, the gas supply lines 150 comprise first and second gas supply lines 152 and 154 which are formed in the upper module 142 and in each of the first through third modules 146, 147 and 148 at the sides opposite to the openings A, and are connected to the inner walls of each stage 114 to flow reaction and purging gases in over the semiconductor substrate 122.

The first supply lines 152 are formed underneath the upper module 142 and the first, second and third modules 146, 147 and 148, and the second supply lines 154 are formed on the first, second, third modules 146, 147 and 148 and the lower module 144. The first and second supply lines 152 and 154 each have one inlet A1 and A2, and a plurality of outlets B1 and B2 (see FIG. 4), which are connected to the round inner walls of the stages 114.

A first reaction gas and a purging gas are alternately injected into the first supply line 152 while a second reaction gas and a purging gas are alternately injected into the second supply line 154. The number of first and second supply lines 152 and 154 is determined according to the kind of reaction gases to be flowed into the stages 114.

Also, the gas supply lines 150 comprise a third supply line 156 which is formed in each of the first through third modules 146, 147 and 148 and the lower module 144 at the assembly part opposite the openings A, and is connected to each hollow portion 115 of the receiving portions 113, respectively.

The third gas supply line 156 is a path for supplying only purging gas to the hollow portions 115. The purging gas is supplied through the third supply line 156 prior to the supply of the first and second reaction gases through the first and second supply lines 152 and 154.

A first buffering line 153 which is hollow, is formed in the middle of the first supply line 152 by assembling the modules 140 having grooves. That is, the upper module 142 and the first, second and third modules 146, 147 and 148 each have a semicircular groove in the undersides thereof, and the first buffering lines 153 are formed by assembling the modules.

Figure 5A:
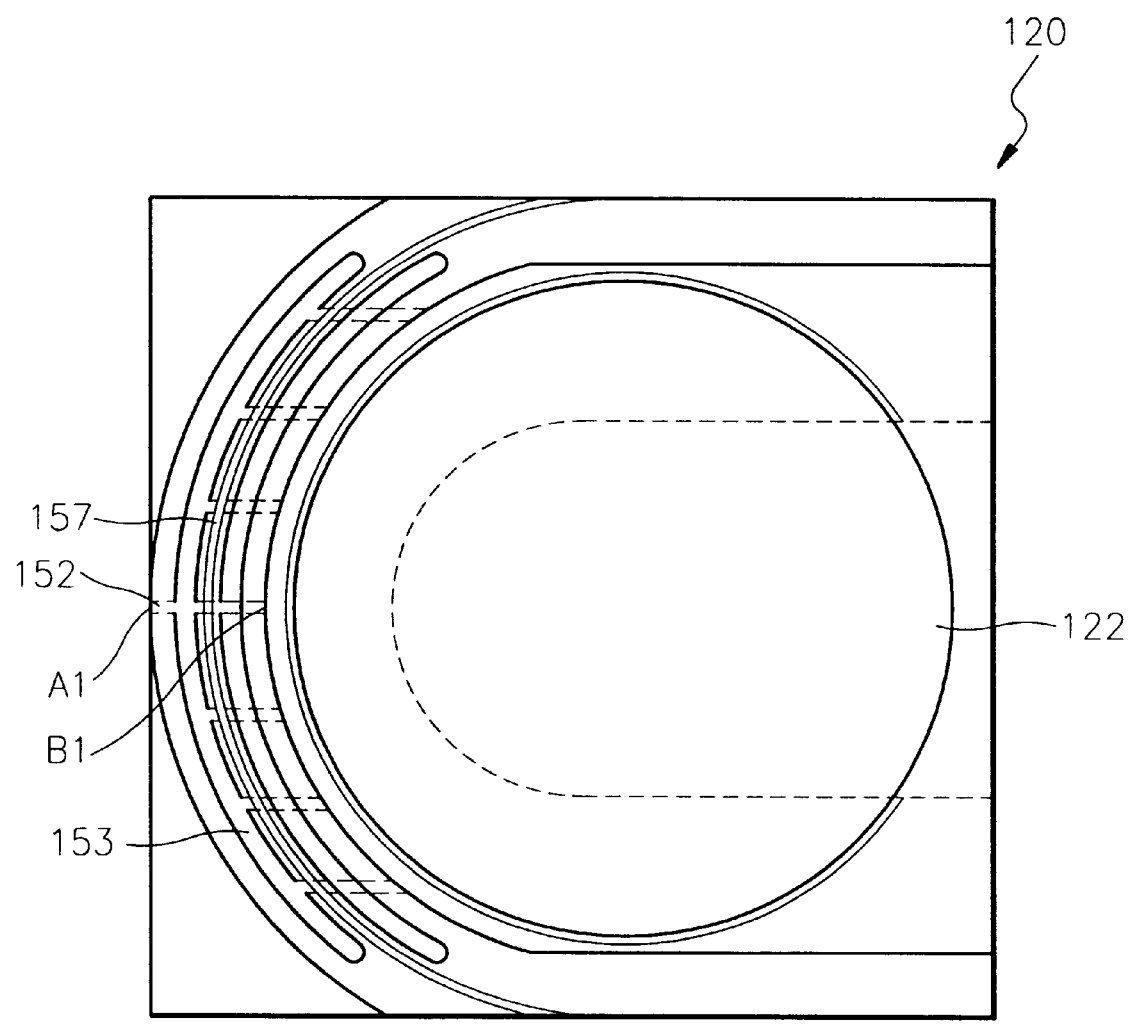
FIGS. 5A and 5B are plan views of an example of the gas supply lines of FIG. 3.

Thus, as shown in FIG. 5A, the first buffering line 153 divides a first reaction gas injected through the inlet A1 of the first supply line 152 to have an equal partial pressure, and then provides to the stages 114 through the plurality of outlets B1.

A second buffering line 155 which is hollow, is formed in the middle of the second supply line 154 by assembling the modules 140 having grooves. That is, the first, second and third modules 146, 147 and 148 and the lower module 144 each have a semicircular groove in the top sides thereof, and the second buffering lines 155 are formed by assembling the modules.

Figure 5B:
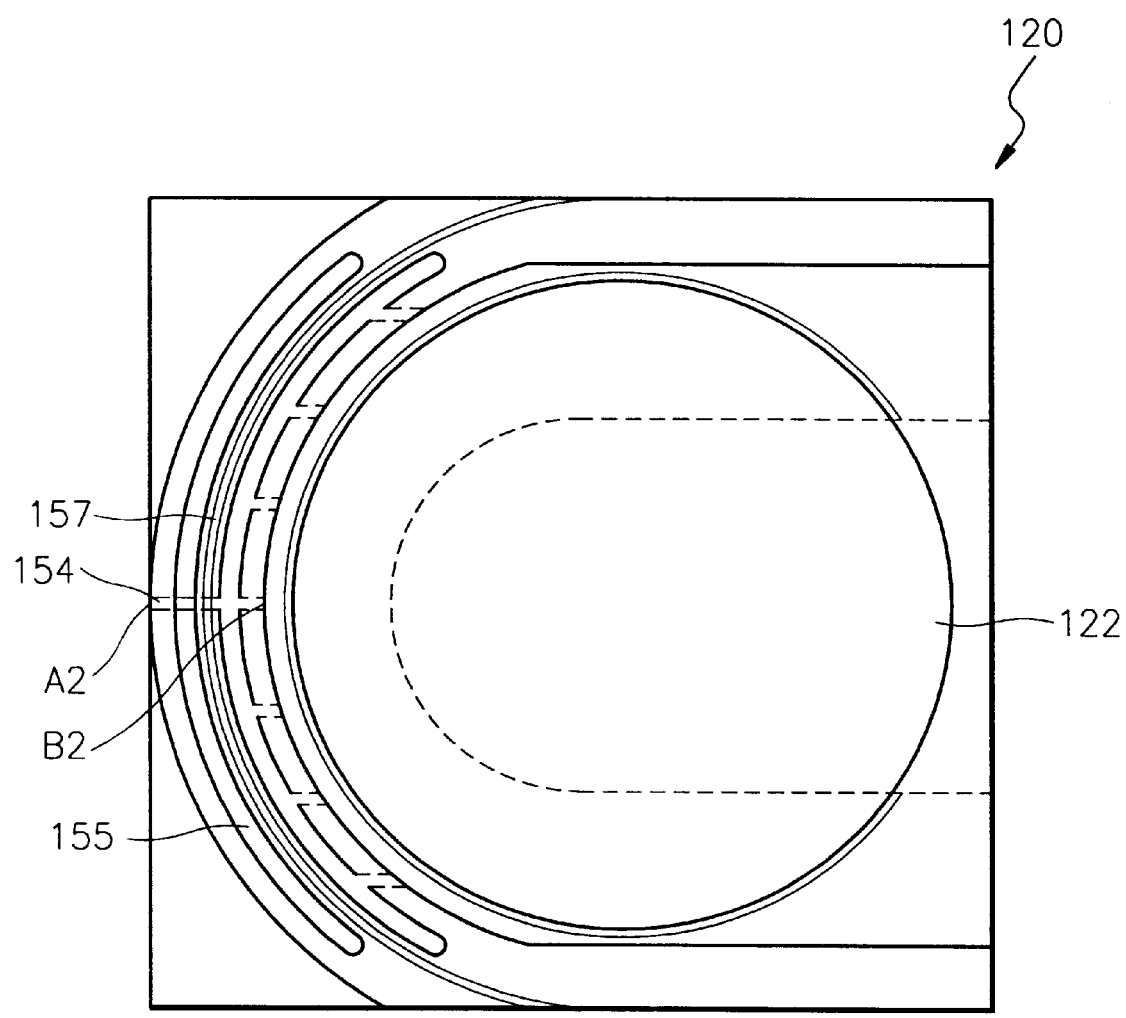

Thus, as shown in FIG. 5B, the second buffering line 155 divides a second reaction gas injected through the inlet A2 of the second supply line 154 to have an equal partial pressure, and then provides the second reaction gas to the stages 114 through the plurality of outlets B2.

That is, the first and second reaction gases are provided to the first and second buffering lines 153 and 155 through the inlets A1 and A2, respectively, and ejected through the plurality of outlets B1 and B2 toward the openings A, such that the first and second reaction gases are evenly distributed on the circular semiconductor substrates 122.

A third buffering line 157 having a semicircular shape as in the first or second buffering line 153 or 155, is formed between the first and second buffering lines 153 and 155. The third buffering line 157 prevents a chemical reaction of the first and second reaction gases leaked through the gaps of the module assembly. Also, the third buffering line 157 discharges the first and second reaction gases which leak therein, through its open ends.

In the operation of the ALD apparatus having the above structure, a plurality of circular semiconductor substrates 122 are transferred one by one into the stages 114 through the openings A of the reactor 120, by the substrate transfer device 102 installed in the vacuum chamber 110. The substrate transfer device 102 goes into the hollow portions 115 to seat the substrates 122 on the receiving portions 113, and goes back out of the hollow portions 115. Before the substrates 122 are seated on the stages 114, the inner space of the stages 114 are heated to a high temperature by the heating members 143 and 145 or a lamp heater (not shown), thereby resulting in a uniform temperature distribution over the substrates 122.

The gas supply portion 130 supplies a first reaction gas to the stages 114 through the first supply lines 152 for a predetermined duration. Then, the first reaction gas is adsorbed as an atomic layer on the substrates 122. The first reaction gas supplied through the inlets A1 from the gas supply portion 130 is provided to the first buffering lines 153 for buffering the pressure difference, and divided to have an equal partial pressure, and then provided to the stages 114 through the plurality of outlets B1. Thus, the pressure of the first reaction gas over the substrates 122 becomes uniform, so that the first reaction gas can be chemically adsorbed as a single atomic layer on the substrates 122.

After the single atomic layer is deposited, the gas supply portion 130 supplies a predetermined amount of purging gas through the inlet A1 of the first supply line 152 to the first buffering line 153, the pressure of the purging gas provided to the first buffering line 153 becomes uniform while flowing in the first buffering line 153, and the purging gas is ejected through the outlets B1 into the stages 114. While the purging gas flows on the substrates 122, the purging gas purges excess first reaction gas which remains after the deposition of the single atomic layer, out of the stages 114 through the openings A of the reactor 120. The purged first reaction gas is exhausted to the outside by a pump (not shown) connected to the vacuum chamber 110.

Also, the gas supply portion 130 supplies a second reaction gas as another source gas through the second supply line 154 into the stages 114. Because the second supply line 154 is connected to the second buffering line 155, the second reaction gas injected through the inlet A2 from the gas supply portion 130 with a predetermined pressure is provided to the second buffering line 155.

While the second reaction gas flows in the second buffering line 155, the pressure of the second reaction gas becomes uniform, and is then divided into equal partial pressures, such that the second reaction gas is ejected through the plurality of outlets B2 into the stages 114. Then, the second reaction gas flows on the atomic layer of the first reaction gas adsorbed on the substrate 122. As a result, the second reaction gas reacts with the first reaction gas on the surface of the chemically absorbed atomic layer, resulting in a desired thin atomic layer.

The first and the second reaction gases must be ejected parallel toward the openings A such that the reaction gases flow evenly over the entire surface of the substrate. If the reaction gases are ejected toward the bottom center of the substrates, the uniformity of a thin film deposited on the substrates 122 is deteriorated.

Then, a purging gas is supplied through the inlet A2 of the second supply line 154 to the second buffering line 155, the pressure of the purging gas provided to the second buffering line 155 becomes uniform while flowing in the second buffering line 155, and the purging gas is ejected through the outlets B2 into the states 114. While the purging gas flows in the stages 114, the by-products of the first and second reaction gases are purged by the purging gas and discharged out of the stages 114 through the openings A of the reactor 120.

The gas supply portion 130 supplies a purging gas, an inert gas, below the substrates 122 through the third supply line 156 before supplying the first and second reaction gases through the first and second supply lines 152 and 154.

The purging gas flows in the hollow portions 115 of the receiving portions 113 connected to the third supply lines 156, which are the paths for the substrate transfer device 102. The purging gas purges the first and second reaction gases which leak in below the substrates 122, that is, in the hollow portions 115, so as to prevent a thin film from being deposited on the underside of the substrates 122. In other words, when the purging gas flows in below the substrates 122 while the first and second reaction gases flow on the substrate 122, the first or second reaction gas which leaks in the hollow portion 115, is purged by the purging gas and discharged out of the stages 114. Here, the flow rate of the purging gas is adjusted to be approximately 30% of that of the first or second reaction gas, such that the purging gas does not affect the internal pressure of the reactor 120. Also, the purging gas makes the thermal distribution over the substrates 122 uniform.

In the ALD apparatus according to the present invention, if the reactor 120 has a minute machining error, the first and second reaction gases can leaks through the gaps of the assembly while being supplied to the stages 114. As a result, the reaction gases chemically react with each other in the first or second buffering line 153 or 155. However, the third buffering line 157 installed between the first and second buffering lines 153 and 155 collects the reaction gases leaked from the first and second buffering lines 153 and 155, and discharges the reaction gases through its open ends.

Figure 6B:
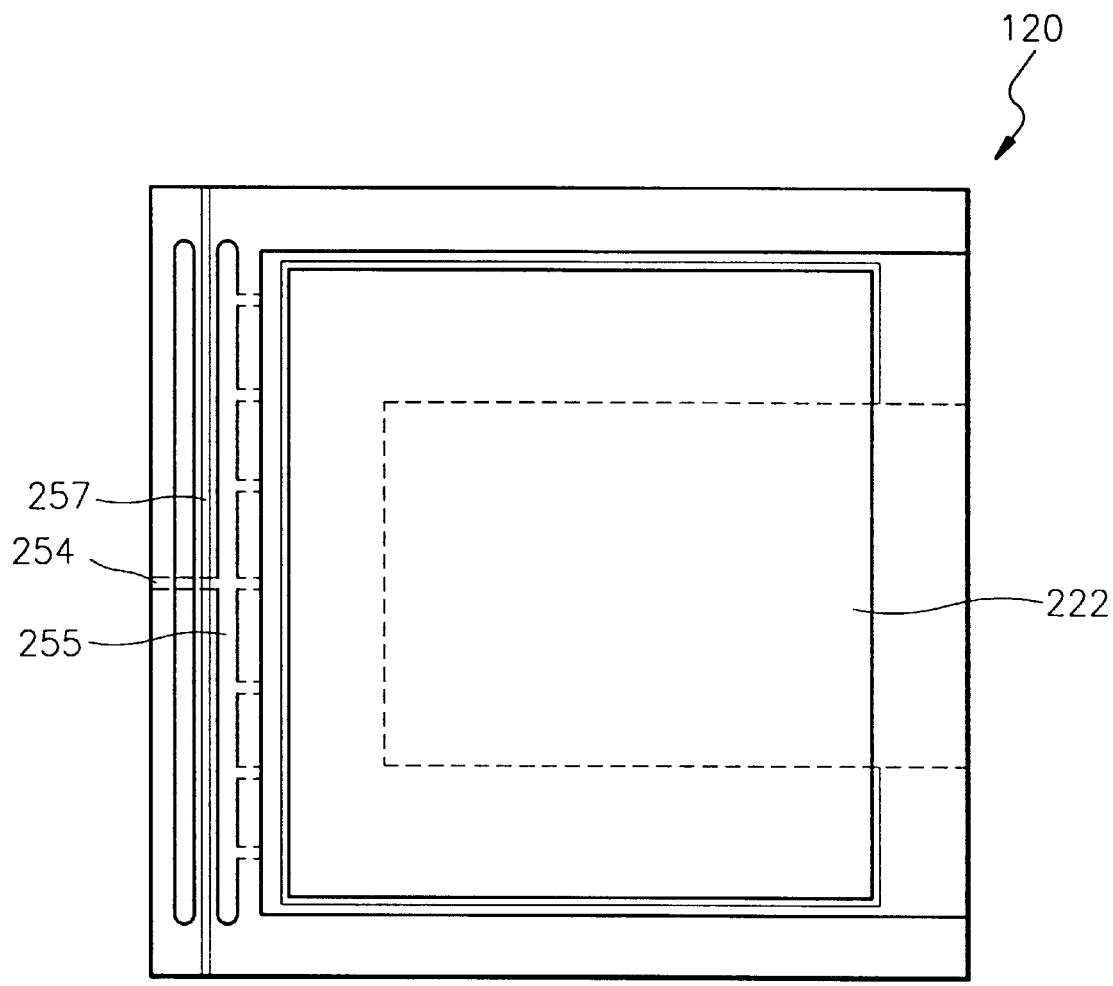

FIGS. 6A and 6B are plan views of another example of the gas supply lines of FIG. 3. Reference numerals which are the same as those in FIG. 3 represent the same elements.

In this example, a rectangular glass substrate 222 is used instead of the above-mentioned circular semiconductor substrate 122. Thus, the sidewalls of the modules and the stages have a rectangular section corresponding to the rectangular glass substrate 222 which is inserted into the assembly of the modules. As shown in FIG. 6A, a first buffering line 253 which is hollow and straight, is formed in the middle of a first supply line 252. The first buffering line 253 is located in the assembly part of the modules, perpendicular to the first supply line 252. As shown in FIG. 6B, a second buffering line 255 which is hollow and straight, is formed in the middle of a second supply line 254. The second buffering line 255 is also located in the assembly part of the modules, perpendicular to the second supply line 254, and a third buffering line 257 is interposed between the first and second buffering lines 253 and 255.

In the above embodiment, the description is limited to the formation of a binary thin film. However, the ALD apparatus according to the present invention can be applied to the formation of a thin film in a complex composition, including a ternary thin film.

As described above, in the ALD apparatus according to the present invention, a thin film having good properties and a desired fine pattern can be simultaneously deposited on a plurality of substrates, or glass substrates for display, so that the deposition efficiency can be improved, resulting in higher throughput.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An atomic layer deposition (ALD) apparatus for depositing an atomic layer on a plurality of substrates, comprising:
   a vacuum chamber;
   a reactor installed in the vacuum chamber, having a plurality of modules which can be assembled and disassembled as desired, a plurality of stages as spaces partitioned by assembling the plurality of modules, and openings which allow each stage to receive one substrate;

a gas supply portion installed in the reactor, for supplying reaction gases and a purging gas to the reactor; and a plurality of gas supply lines installed in the modules, for injecting the gases from the gas supply portion into the stages.

2. The apparatus of claim 1, wherein the reaction gases and the purging gas are discharged through the openings.

3. The apparatus of claim 1, wherein heating members are installed in upper and lower modules of the plurality of modules to keep the internal temperature of the reactors at a predetermined level.

4. The apparatus of claim 3, wherein the heating members are heat-emitting blocks which can be inserted into the upper and lower modules.

5. The apparatus of claim 1, further comprising a lamp heater outside the vacuum chamber, for emitting light to keep the internal temperature of the reactor at a predetermined level.

6. The apparatus of claim 1, wherein the stages can receive substrates, and have inner walls having a section corresponding to the shape of the substrates inserted thereinto.

7. The apparatus of claim 6, wherein the substrates are circular semiconductor substrates and each stage comprises a circular receiving portion having a hollow portion, formed at the bottom of the stage, for receiving the semiconductor substrate.

8. The apparatus of claim 6, wherein the substrates are rectangular glass substrates and each stage comprises a rectangular receiving portion having a hollow portion, formed on the bottom of the stage, for receiving the semiconductor substrate.

9. The apparatus of claim 1, wherein the gas supply lines comprise:

first and second supply lines formed in the modules to be connected to the inner wall of each stage; and a third supply line formed in the modules to be connected to each hollow portion.

10. The apparatus of claim 9, wherein the first and second supply lines each comprise:

an inlet; and a plurality of outlets connected to the inner wall of each stage having the section corresponding to the shape of the substrates inserted thereinto.

11. The apparatus of claim 9, wherein the reaction gas and the purging gas are alternately supplied through the first and second supply lines, and only the purging gas is supplied through the third supply line so as to make the temperature distribution over the substrate uniform and to prevent the deposition of a thin film on the underside of the substrate by the reaction gas.

12. The apparatus of claim 9, wherein the flow rate of the purging gas flowing through the third supply line is 30% less than those of the reaction gases supplied through the first and second supply lines.

13. The apparatus of claim 9, further comprising semi-circular first and second buffering lines connected to the first and second supply lines in the middle of the first and second supply lines, respectively, formed in the assembly part of the modules, for collecting the reaction gases provided through the first and second supply lines to supply the reaction gases to each stage with an equal pressure.

14. The apparatus of claim 9, further comprising straight first and second buffering lines connected to the first and second supply lines in the middle of the first and second supply lines, respectively, formed in the assembly part of the modules, for collecting the reaction gases provided through the first and second supply lines to supply the reaction gases to each stage with an equal pressure.

15. The apparatus of claim 13, further comprising a third buffering line formed between the first and second buffering lines so as to prevent a chemical reaction of the reaction gases which leak through the gap of the module assembly from the first and second buffering lines.

16. The apparatus of claim 14, further comprising a third buffering line formed between the first and second buffering lines so as to prevent a chemical reaction of the reaction gases which leak through the gap of the module assembly from the first and second buffering lines.

17. The apparatus of claim 1, where in the reactor is formed of at least one material selected from the group consisting of titanium (Ti), aluminum (Al), molybdenum (Mo), tungsten (W), graphite, belyllia, silicon carbide and silicon nitride.

* * * * *